United States Patent
Kim et al.

(10) Patent No.: US 8,710,675 B2
(45) Date of Patent: Apr. 29, 2014

(54) INTEGRATED CIRCUIT PACKAGE SYSTEM WITH BONDING LANDS

(75) Inventors: Young Cheol Kim, Yongin-si (KR); Koo Hong Lee, Seoul (KR)

(73) Assignee: Stats Chippac Ltd., Singapore (SG)

( * ) Notice: Subject to any disclaimer, the term of this patent is extended or adjusted under 35 U.S.C. 154(b) by 1027 days.

(21) Appl. No.: 11/677,477

(22) Filed: Feb. 21, 2007

(65) Prior Publication Data

US 2007/0194462 A1    Aug. 23, 2007

Related U.S. Application Data

(60) Provisional application No. 60/766,953, filed on Feb. 21, 2006.

(51) Int. Cl.
| | | |
|---|---|---|
| *H01L 23/48* | (2006.01) | |
| *H01L 29/40* | (2006.01) | |
| *H01L 23/52* | (2006.01) | |
| *H01L 21/44* | (2006.01) | |

(52) U.S. Cl.
USPC ........... 257/777; 257/692; 257/686; 257/787; 257/E23.043; 257/E23.085; 438/123; 438/124; 438/666

(58) Field of Classification Search
USPC ................. 257/692, 777, E23.047, E23.124, 257/E25.023, 686, 787, E23.043, E23.085; 438/123, 124, 666
See application file for complete search history.

(56) References Cited

U.S. PATENT DOCUMENTS

| | | | | |
|---|---|---|---|---|
| 5,373,189 | A | * | 12/1994 | Massit et al. ................... 257/686 |
| 5,780,925 | A | * | 7/1998 | Cipolla et al. ................. 257/676 |
| 6,005,778 | A | * | 12/1999 | Spielberger et al. .......... 361/770 |
| 6,329,711 | B1 | | 12/2001 | Kawahara et al. |
| 6,376,904 | B1 | * | 4/2002 | Haba et al. ..................... 257/686 |
| 6,476,474 | B1 | | 11/2002 | Hung |
| 6,518,655 | B2 | | 2/2003 | Morinaga et al. |
| 6,605,866 | B1 | | 8/2003 | Crowley et al. |
| 6,605,875 | B2 | * | 8/2003 | Eskildsen ....................... 257/777 |
| 6,630,729 | B2 | | 10/2003 | Huang |
| 6,843,421 | B2 | * | 1/2005 | Chhor et al. ................... 235/492 |
| 7,420,269 | B2 | * | 9/2008 | Ha et al. ......................... 257/686 |
| 7,498,667 | B2 | * | 3/2009 | Ha et al. ......................... 257/686 |
| 7,645,638 | B2 | * | 1/2010 | Kim et al. ....................... 438/123 |
| 2002/0121679 | A1 | * | 9/2002 | Bazarjani et al. .............. 257/666 |
| 2002/0195697 | A1 | * | 12/2002 | Mess et al. ..................... 257/686 |
| 2003/0189256 | A1 | * | 10/2003 | Corisis et al. .................. 257/777 |
| 2003/0218896 | A1 | * | 11/2003 | Pon et al. ......................... 365/63 |
| 2004/0056277 | A1 | * | 3/2004 | Karnezos ....................... 257/200 |
| 2007/0158799 | A1 | * | 7/2007 | Chiu et al. ...................... 257/678 |
| 2008/0135989 | A1 | * | 6/2008 | Jang et al. ...................... 257/659 |

FOREIGN PATENT DOCUMENTS

| | | |
|---|---|---|
| KR | 1020010064913 A | 7/2001 |
| KR | 1020010064914 A | 7/2001 |

* cited by examiner

*Primary Examiner* — Zandra Smith
*Assistant Examiner* — Tsz Chiu
(74) *Attorney, Agent, or Firm* — Ishimaru & Associates LLP

(57) ABSTRACT

An integrated circuit package system includes a first integrated circuit die having die pads only adjacent a single edge of the first integrated circuit die, forming first bonding lands adjacent the single edge, connecting the die pads and the first bonding lands, and encapsulating the die pads and a portion of the first bonding lands to form a first package.

12 Claims, 3 Drawing Sheets

INTEGRATED CIRCUIT PACKAGE SYSTEM WITH BONDING LANDS

CROSS-REFERENCE TO RELATED APPLICATION(S)

This application claims the benefit of U.S. Provisional Patent Application Ser. No. 60/766,953 filed Feb. 21, 2006.

TECHNICAL FIELD

The present invention relates generally to semiconductor technology, and more particularly to an integrated circuit thin package system.

BACKGROUND ART

Greater package density of integrated circuit ("IC"), reduced size of components, increased performance, and lower cost continue to drive the computer industry. The number of devices used to fabricate the next generation IC products often decrease due to advances in technology while the functionality of these products increases. Modern consumer electronics particularly personal portable devices, such as cellular phones, digital cameras, memory cards, MP3 players and other personal music players (PMP), require increasing functions to fit an ever-shrinking physical space.

Semiconductor package structures continue to advance toward miniaturization and thinning to increase the density of the components that are packaged therein while decreasing the sizes of the products that are made therefrom. This is in response to continually increasing demands on information and communication apparatus for ever-reduced sizes, thicknesses, and costs, along with ever-increasing performance.

These increasing requirements for miniaturization are particularly noteworthy, for example, in portable information and communication devices such as cell phones, hands-free cell phone headsets, personal data assistants ("PDA's"), camcorders, notebook personal computers, and so forth. All of these devices continue to be made smaller and thinner to improve their portability. Accordingly, large scale integrated circuit ("LSI") packages that are incorporated into these devices are required to be made smaller and thinner, and the package configurations that house and protect them are required to be made smaller and thinner as well.

Many conventional semiconductor die (or "chip") packages are of the type where a semiconductor die is molded into a package with a resin, such as an epoxy molding compound. The packages have a leadframe whose out leads are projected from the package body, to provide a path for signal transfer between the die and external devices. Other conventional package configurations have contact terminals or pads formed directly on the surface of the package.

Such a conventional semiconductor package is fabricated through the following processes: a die-bonding process (mounting the semiconductor die onto the paddle of a leadframe), a wire-bonding process (electrically connecting the semiconductor die on the paddle to inner leads using leadframe wires), a molding process (encapsulating a predetermined portion of the assembly, containing the die, inner leads and leadframe wires, with an epoxy resin to form a package body), and a trimming process (completing each assembly as individual, independent packages).

The semiconductor packages, thus manufactured, are then mounted by matching and soldering the external leads or contact pads thereof to a matching pattern on a circuit board, to thereby enable power and signal input/output ("I/O") operations between the semiconductor devices in the packages and the circuit board.

An exemplary semiconductor package, well known in the electronics industry, is the ball-grid array ("BGA"). BGA packages typically comprise a substrate, such as a printed circuit board ("PCB"), with a semiconductor die having a multitude of bond pads mounted to the top side of the substrate. Wire bonds electrically connect the bond pads to a series of metal traces on the top side of the PCB. This series of metal traces is connected to a second series of metal traces on the back side of the PCB through a series of vias located around the outer periphery of the PCB. The second series of metal traces each terminates with a contact pad where a conductive solder ball is attached. Typically, the semiconductor die and the wire bonds are encapsulated within a molding compound.

Still thinner, smaller, and lighter package designs and mounting/connecting configurations have been adopted in response to continuing requirements for further miniaturization. At the same time, users are demanding semiconductor packages that are more reliable under increasingly severe operating conditions.

Thus, a need still remains for an integrated circuit package system to lower costs with higher performance, increased miniaturization, and greater packaging densities, to provide and support systems that are capable of achieving optimal thin, high-density footprint semiconductor systems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a first integrated circuit die having die pads only adjacent a single edge of the first integrated circuit die, forming first bonding lands adjacent the single edge, connecting the die pads and the first bonding lands, and encapsulating the die pads and a portion of the first bonding lands to form a first package.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
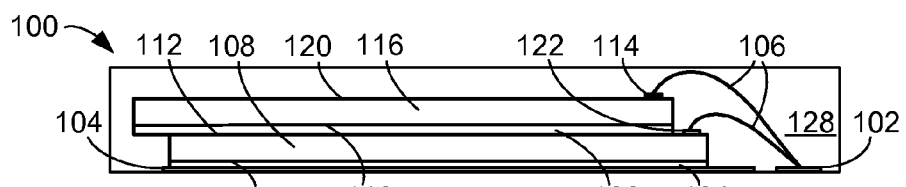
FIG. 1 is a cross-sectional view, taken from FIG. 4 along a line segment 1-1, of an integrated circuit package system.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGS. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane.

The term "on" as used herein means and refers to direct contact among elements. The term "processing" as used herein includes deposition of material, patterning, exposure, development, etching, cleaning, and/or removal of the material or trimming as required in forming a described structure. The term "system" as used herein means and refers to the method and to the apparatus of the present invention in accordance with the context in which the term is used.

Referring now to FIG. 1, therein is a cross-sectional view of an integrated circuit package system 100. The integrated circuit package system 100 can include a leadframe (not shown) having bonding lands 102 and a base plane 104, such as a ground or power plane. A process, such as etching, can be applied to a copper (Cu) alloy to form the bonding lands 102 or the base plane 104. Optionally, the bonding lands 102 and the base plane 104 can also be formed by a process, such as plating, to provide a thin profile or thickness of the integrated circuit package system 100. The thin profile or thickness can be about 230 um or less, providing high density stacking as a known good package (KGP) for a next level system, such as high density memory. The bonding lands 102 can be formed in a single row, a dual row, or any number of rows having a pitch of 0.5 mm or less.

Connectors 106, such as bond wires, can electrically connect a first integrated circuit die 108 preferably formed with a first die back side 110 and a first die active side 112 having first die pads 114. The connectors 106 can also electrically connect a second integrated circuit die 116 preferably formed with a second die back side 118 and a second die active side 120 having second die pads 122. The connectors 106 connect the first die pads 114 and the second die pads 122 to the bonding lands 102.

The first die back side 110 of the first integrated circuit die 108 can be attached over the base plane 104 with a first attach layer 124, such as an adhesive. The second die back side 118 of the second integrated circuit die 116 can be attached over the first die active side 112 of the first integrated circuit die 108 with a second attach layer 126. The second integrated circuit die 116 is preferably stacked having an offset from the first integrated circuit die 108 substantially exposing the first die pads 114 and providing spacing for the connectors 106.

A process, such as molding, can apply an encapsulant 128 to provide structural integrity and protection to the integrated circuit package system 100. The encapsulant 128 can be formed over the first integrated circuit die 108, the second integrated circuit die 116, the connectors 106, the bonding lands 102, and the base plane 104. The encapsulant 128 can provide a lower surface of the base plane 104 and a lower surface of the bonding lands 102 substantially exposed. The bonding lands 102 are within and partially exposed from the encapsulant 128.

For illustrative purposes, one set of the bonding lands 102 are shown on a same side of the integrated circuit package system 100, such as a single in-line package, although it is understood that the bonding lands 102 may be configured differently. Further for illustrative purposes, the first integrated circuit die 108 and the second integrated circuit die 116 are connected on the same side of the integrated circuit package system 100 although it is understood that the first integrated circuit die 108 and the second integrated circuit die 116 may be connected on any side.

Figure 2:
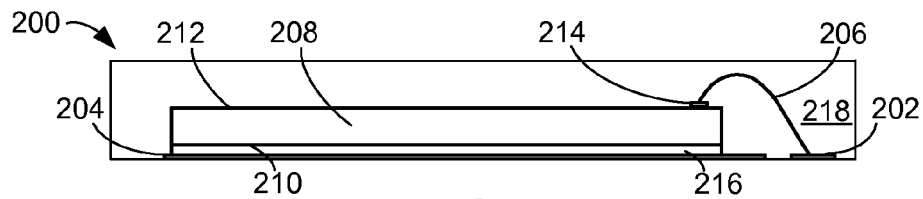
FIG. 2 is a cross-sectional view of an integrated circuit package system in an alternative embodiment of the present invention.

Referring now to FIG. 2, therein is shown a cross-sectional view of an integrated circuit package system 200 in an alternative embodiment of the present invention. In a manner similar to the integrated circuit package system 100, the integrated circuit package system 200 can include a leadframe (not shown) having bonding lands 202 and a base plane 204, such as a ground or power plane. The bonding lands 202 can be formed in single in-line package (SIP) form.

Connectors 206, such as bond wires, can electrically connect an integrated circuit die 208 preferably formed having a die back side 210 and a die active side 212 having die pads 214. The die pads 214 can be attached to the bonding lands 202 with the connectors 206. The integrated circuit die 208 can be attached over the base plane 204 with an attach layer 216, such as an adhesive.

A process, such as etching, can be applied to a copper (Cu) alloy to form the bonding lands 202 or the base plane 204. Optionally, the bonding lands 202 and the base plane 204 can also be formed by a process, such as plating, to provide an extremely thin profile or thickness of the integrated circuit package system 200. The integrated circuit package system 200 with one of the integrated circuit die 208 can be extremely thin, such as having a profile or thickness of 0.20 mm or less, providing high density stacking as a known good package (KGP) for a next level system, such as high density memory.

A process, such as molding, can apply an encapsulant 218 to provide structural integrity and protection to the integrated circuit package system 200. The encapsulant 218 can be formed over the integrated circuit die 208, the connectors 206, the bonding lands 202, and the base plane 204. The encapsulant 218 can provide a lower surface of the base plane 204 and a lower surface of the bonding lands 202 substantially exposed.

Figure 3:
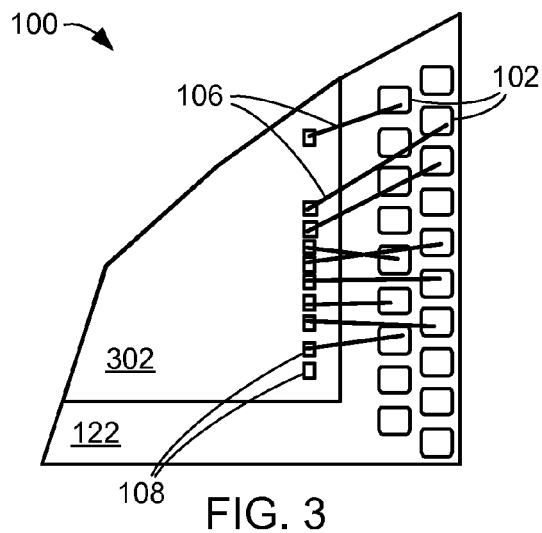
FIG. 3 is a top plan view of the structures of FIGS. 1 and 2.

Referring now to FIG. 3, therein is shown a top plan view of the structures of FIGS. 1 and 2. As an example, the integrated circuit package system 100 includes the bonding lands 102, such as the bonding lands 202 of FIG. 2, and an active surface 302 of the first integrated circuit die 108 of FIG. 1 or the integrated circuit die 208 of FIG. 2. The bonding lands 102 are connected by the connectors 106, such as the connectors 206 of FIG. 2. The connectors 106 also connect the first die pads 114, such as the die pads 214 of FIG. 2. The bonding lands 102 can be formed in a single row, a dual row, or any number of rows.

Figure 4:
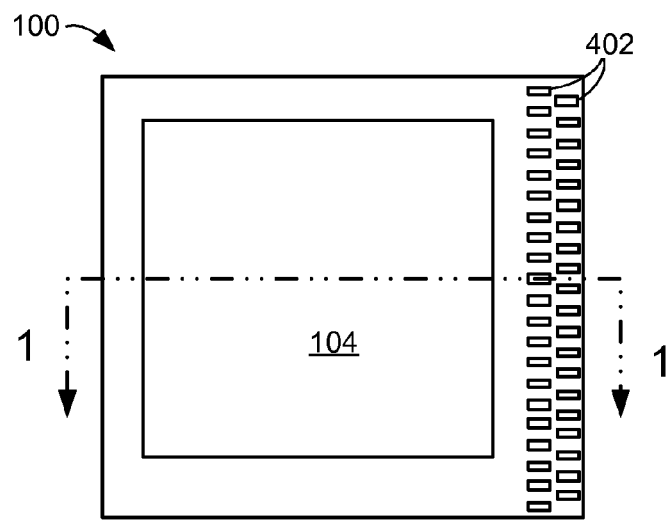
FIG. 4 is a bottom plan view of the structures of FIGS. 1 and 2.

Referring now to FIG. 4, therein is shown a bottom plan view of the structures of FIGS. 1 and 2. As an example, the integrated circuit package system 100 includes the base plane 104, such as the base plane 204 of FIG. 2. Package lands 402 can be formed over the bonding lands 102 of FIG. 2 or the bonding lands 202 of FIG. 2. The package lands 402 can be formed by a process, such as plating or etching, to provide an external connectivity surface. The base plane 104, such as the base plane 204 of FIG. 2, is substantially exposed from the encapsulant 128, such as the encapsulant 218 of FIG. 2. The package lands 402 can be formed with the bonding lands 102 or by plating over the bonding lands 102. The package lands 402 and the base plane 104 can also provide connectivity, such as to power or ground level signals, or conductivity, such as for heat dissipation.

Figure 5:
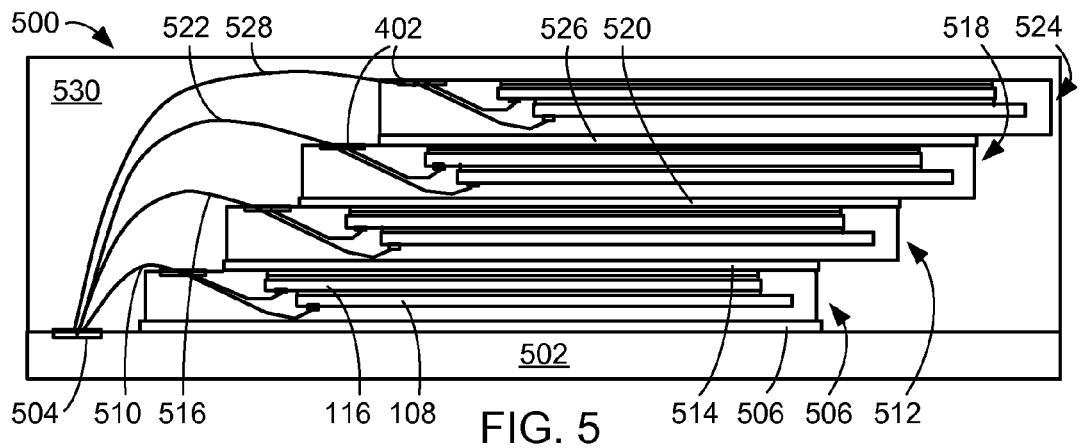
FIG. 5 is a cross-sectional view of an integrated circuit package system in another alternative embodiment of the present invention.

Referring now to FIG. 5, therein is shown a cross-sectional view of an integrated circuit package system 500 in another alternative embodiment of the present invention. The integrated circuit package system 500 includes two or more of the integrated circuit package system 100 of FIG. 1 as known good packages (KGP). Each of the integrated circuit package system 100 can be validated, such as testing, providing a KGP in a stacked package improving final package yield. The first integrated circuit die 108 and the second integrated circuit die 116 can be substantially the same providing high density functions, such as four, eight, or more high density memory die. The integrated circuit package system 500 can also include the package lands 402 and a base substrate 502 having a substrate pad 504, such as a wire bonding pad.

A first package 506, such as the integrated circuit package system 100, can be attached to the base substrate 502 with a first attach layer 508. The package lands 402 of the first package 506 can be connected to the substrate pad 504 with first package connectors 510, such as wire bonds. A test process can be applied to the package lands 402 to provide the first package 506 as a KGP.

In a manner similar to the first package 506, a second package 512, such as the integrated circuit package system 100, can be attached to the first package 506 with a second attach layer 514. The second package 512 can be placed having an offset substantially exposing the package lands 402 of the first package 506. The package lands 402 of the second package 512 can be connected to the substrate pad 504 with second package connectors 516, such as wire bonds. A test process can be applied to the package lands 402 to provide the second package 512 as a KGP.

Similar to the second package 512, a third package 518, such as the integrated circuit package system 100, can be attached to the second package 512 with a third attach layer 520. The third package 518 can be placed having an offset substantially exposing the package lands 402 of the second package 512. The package lands 402 of the third package 518 can be connected to the substrate pad 504 with third package connectors 522, such as wire bonds. A test process can be applied to the package lands 402 to provide the third package 518 as a KGP.

Similarly, a fourth package 524, such as the integrated circuit package system 100, can be attached to the third package 518 with a fourth attach layer 526. The fourth package 524 can be placed having an offset substantially exposing the package lands 402 of the third package 518. The package lands 402 of the fourth package 524 can be connected to the substrate pad 504 with fourth package connectors 528, such as wire bonds. A test process can be applied to the package lands 402 to provide the fourth package 524 as a KGP.

The base substrate 502 provides integration of the first package 506, the second package 512, the third package 518, and the fourth package 524 in the z-dimension with interconnection on a single side of the base substrate 502. Single side interconnection can provide improved dimensions of the integrated circuit package system 500 particularly with similar packages or devices. An encapsulant 530 can be applied to provide structural integrity and protect the integrated circuit package system 500.

Figure 6:
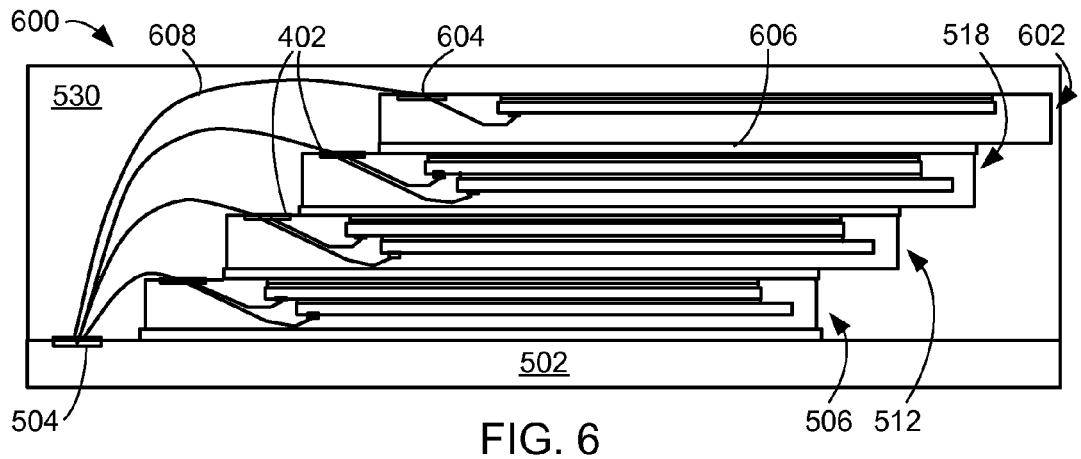
FIG. 6 is a cross-sectional view of an integrated circuit package system in yet another alternative embodiment of the present invention.

Referring now to FIG. 6, therein is shown a cross-sectional view of an integrated circuit package system 600 in yet another alternative embodiment of the present invention. In a manner similar to the integrated circuit package system 500, the integrated circuit package system 600 includes the first package 506, the second package 512, and the third package 518.

A fourth package 602, such as the integrated circuit package system 200, includes package lands 604 over the bonding lands 202 of FIG. 2. The fourth package 602 can be attached over the third package 518 with a fourth attach layer 606. The fourth package 602 can be placed having an offset substantially exposing the package lands 402 of the third package 518. The package lands 604 of the fourth package 602 can be connected to the substrate pad 504 with fourth package connectors 608, such as wire bonds. A test process can be applied to the package lands 604 to provide the fourth package 602 as a KGP.

The base substrate 502 provides integration of the first package 506, the second package 512, the third package 518, and the fourth package 602 in the z-dimension with interconnection on a single side of the base substrate 502. Single side interconnection can provide improved dimensions of the integrated circuit package system 600 particularly with similar packages or devices. The encapsulant 530 can be applied to provide structural integrity and protect the integrated circuit package system 600.

Figure 7:
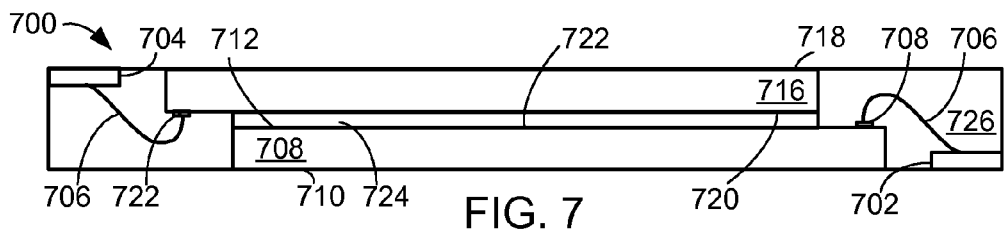
FIG. 7 a cross-sectional view of an integrated circuit package system in yet another alternative embodiment of the present invention.

Referring now to FIG. 7, therein is shown a cross-sectional view of an integrated circuit package system 700 in yet another alternative embodiment of the present invention. The integrated circuit package system 700 can include a leadframe (not shown) having first bonding lands 702 and second bonding lands 704. A process, such as etching, can be applied to a copper (Cu) alloy to form the first bonding lands 702 or the second bonding lands 704. Optionally, the first bonding lands 702 and the second bonding lands 704 can also be formed by a process, such as plating. The integrated circuit package system 700 can provide high density stacking as a known good package (KGP) for a next level system, such as high density memory. The first bonding lands 702 can be formed in a single row, a dual row, or any number of rows.

Connectors 706, such as bond wires, can electrically connect a first integrated circuit die 708 can preferably be formed having a first die back side 710 and a first die active side 712 having first die pads 714. The connectors 706 can also electrically connect a second integrated circuit die 716 preferably formed having a second die back side 718 and second die active side 720 having second die pads 722. The connectors 706 can connect the first die pads 714 to the first bonding lands 702 and the second die pads 722 to the second bonding lands 704.

The second die active side 720 of the second integrated circuit die 716 can be attached over the first die active side 712 of the first integrated circuit die 708 with an attach layer 724 such as an adhesive. The first die active side 712 can preferably face the second die active side 720. The second integrated circuit die 716 can also be stacked having an offset from the first integrated circuit die 708 substantially exposing the first die pads 714 and providing spacing for the connectors 706.

A process, such as molding, can apply an encapsulant 726 to provide structural integrity and protection to the integrated circuit package system 700. The encapsulant 726 can be formed over the first integrated circuit die 708, the second integrated circuit die 716, the connectors 706, the first bonding lands 702, and the second bonding lands 704. The first bonding lands 702 and the second bonding lands 704 can provide testing of the integrated circuit package system 700 to provide a known good package (KGD). The integrated circuit package system 700 can be stacked on another of the integrated circuit package system 700 or another package providing high density functions with KGD.

Figure 8:
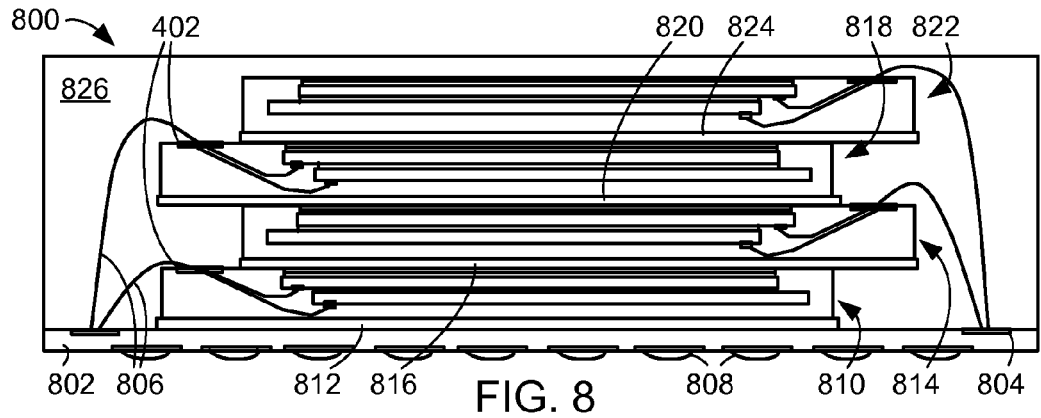
FIG. 8 is an integrated circuit package system in yet another alternative embodiment of the present invention.

Referring now to FIG. 8, therein is shown an integrated circuit package system 800 in yet another alternative embodiment of the present invention. The integrated circuit package system 800 can provide a package in package (PIP) with laminate type. The integrated circuit package system 800 can include two or of the integrated circuit package system 100 of FIG. 1 as known good packages (KGP). Each of the integrated circuit package system 100 can be validated, such as testing, providing a KGP in a stacked package improving final package yield. The integrated circuit package system 800 can also include the package lands 402, a laminate substrate 802 having substrate pads 804 such as wire bonding pads, package connectors 806 such as wire bonds, and substrate connectors 808 for connectivity to a next level system such as a printed circuit board.

A first package 810, such as the integrated circuit package system 100, can be attached over the laminate substrate 802 with a first attach layer 812. The package lands 402 of the first package 810 can be connected to the substrate pads 804 with the package connectors 806. A second package 814, such as the integrated circuit package system 100, can be attached over the first package 810 with a second attach layer 816, the second package 814 having the package lands 402 on a side opposite the package lands 402 of the first package 810. Further, the second package 814 can be attached having an offset from the first package 810 providing the package lands 402 of the first package 810 substantially exposed.

In a similar manner, a third package 818, such as the integrated circuit package system 100, can be attached over the second package 814 with a third attach layer 820, the third package 818 having the package lands 402 of the third package 818 on a side opposite the package lands 402 of the second package 814. Further, the third package 818 can be attached having an offset from the second package 814 providing the package lands 402 of the second package 814 substantially exposed. Similarly, a fourth package 822, such as the integrated circuit package system 100, can be attached over the third package 818 with a fourth attach layer 824, the fourth package 822 having the package lands 402 of the fourth package 822 on a side opposite the package lands 402 of the third package 818. Further, the fourth package 822 can be attached having an offset from the third package 818 providing the package lands 402 of the third package substantially exposed.

A process, such as molding, can apply an encapsulant 826 to provide structural integrity and protection to the integrated circuit package system 800. The encapsulant 826 can be formed over the first package 810, the second package 814, the third package 818, the fourth package 822, the package connectors 806, the substrate pads 804, and a portion of the laminate substrate 802.

Figure 9:
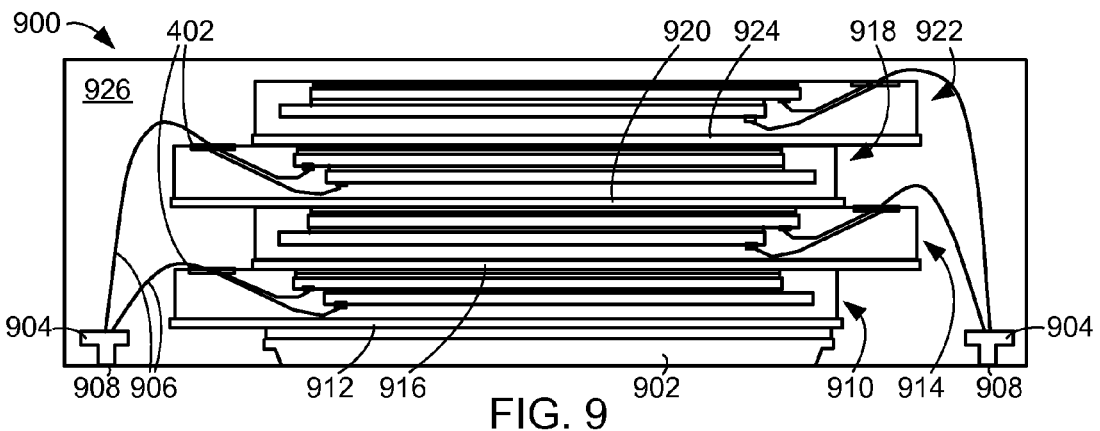
FIG. 9 is an integrated circuit package system in yet another alternative embodiment of the present invention.

Referring now to FIG. 9, therein is shown an integrated circuit package system 900 in yet another alternative embodiment of the present invention. The integrated circuit package system 900 can provide a package in package (PIP) with leadframe type. The integrated circuit package system 900 can include two or of the integrated circuit package system 100 of FIG. 1 as known good packages (KGP). Each of the integrated circuit package system 100 can be validated, such as testing, providing a KGP in a stacked package improving final package yield. The integrated circuit package system 900 can also include the package lands 402, a leadframe (not shown) having a die paddle 902 with package leads 904, package connectors 906 such as wire bonds, and external lead surfaces 908 of the package leads 904 for connectivity to a next level system such as a printed circuit board.

A first package 910, such as the integrated circuit package system 100, can be attached over the die paddle 902 with a first attach layer 912. The package lands 402 of the first package 910 can be connected to the package leads 904 with the package connectors 906. A second package 914, such as the integrated circuit package system 100, can be attached over the first package 910 with a second attach layer 916, the second package 914 having the package lands 402 on a side opposite the package lands 402 of the first package 910. Further, the second package 914 can be attached having an offset from the first package 910 providing the package lands 402 of the first package 910 substantially exposed.

In a similar manner, a third package 918, such as the integrated circuit package system 100, can be attached over the second package 914 with a third attach layer 920, the third package 918 having the package lands 402 of the third package 918 on a side opposite the package lands 402 of the second package 914. Further, the third package 918 can be attached having an offset from the second package 914 providing the package lands 402 of the second package 914 substantially exposed. Similarly, a fourth package 922, such as the integrated circuit package system 100, can be attached over the third package 918 with a fourth attach layer 924, the fourth package 922 having the package lands 402 of the fourth package 922 on a side opposite the package lands 402 of the third package 918. Further, the fourth package 922 can be attached having an offset from the third package 918 providing the package lands 402 of the third package substantially exposed.

A process, such as molding, can apply an encapsulant 926, such as an additional encapsulant, to provide structural integrity and protection to the integrated circuit package system 900. The encapsulant 926 can be formed over the first package 910, the second package 914, the third package 918, the fourth package 922, the package connectors 906, the package leads 904, and a portion of the die paddle 902. The encapsulant can further provide the die paddle 902 and the package leads 904 partially exposed providing connection surfaces for electrical signals or electrical levels such as power or ground.

Figure 10:
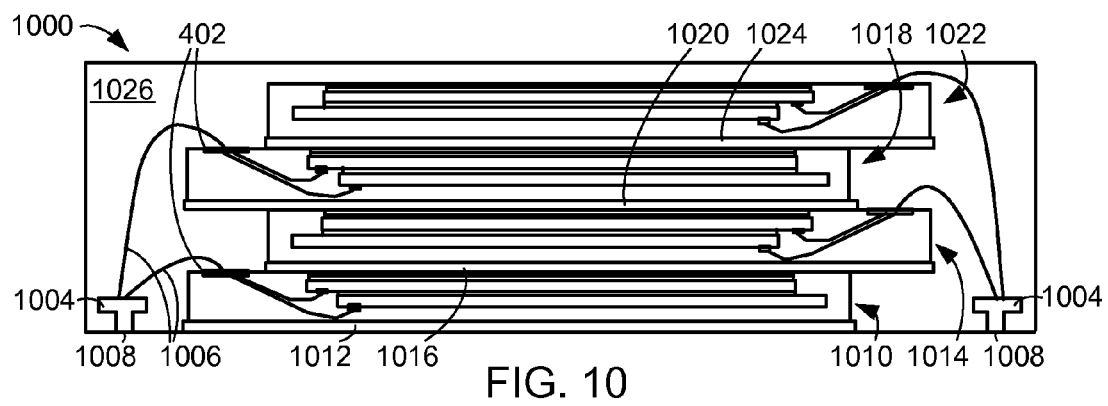
FIG. 10 is an integrated circuit package system in yet another alternative embodiment of the present invention.

Referring now to FIG. 10, therein is shown an integrated circuit package system 1000 in yet another alternative embodiment of the present invention. The integrated circuit package system 1000 can provide a package in package (PIP) with leadframe type. The integrated circuit package system 1000 can include two or of the integrated circuit package system 100 of FIG. 1 as known good packages (KGP). Each of the integrated circuit package system 100 can be validated, such as testing, providing a KGP in a stacked package improving final package yield. The integrated circuit package system 1000 can also include the package lands 402, a leadframe (not shown) having package leads 1004, package connectors 1006 such as wire bonds, and external lead surfaces 1008 of the package leads 1004 for connectivity to a next level system such as a printed circuit board.

A first package 1010, such as the integrated circuit package 100, can be attached substantially planar to the external lead surfaces 1008 with a first attach layer 1012. The package lands 402 of the first package 1010 can be connected to the package leads 1004 with the package connectors 1006. A second package 1014, such as the integrated circuit package 100, can be attached over the first package 1010 with a second attach layer 1016, the second package 1014 having the package lands 402 on a side opposite the package lands 402 of the first package 1010. Further, the second package 1014 can be attached having an offset from the first package 1010 providing the package lands 402 of the first package 1010 substantially exposed.

In a similar manner, a third package 1018, such as the integrated circuit package 100, can be attached over the second package 1014 with a third attach layer 1020, the third package 1018 having the package lands 402 of the third package 1018 on a side opposite the package lands 402 of the second package 1014. Further, the third package 1018 can be attached having an offset from the second package 1014 providing the package lands 402 of the second package 1014 substantially exposed. Similarly, a fourth package 1022, such as the integrated circuit package 100, can be attached over the third package 1018 with a fourth attach layer 1024, the fourth package 1022 having the package lands 402 of the fourth package 1022 on a side opposite the package lands 402 of the third package 1018. Further, the fourth package 1022 can be attached having an offset from the third package 1018 providing the package lands 402 of the third package substantially exposed.

A process, such as molding, can apply an encapsulant 1026 to provide structural integrity and protection to the integrated circuit package system 1000. The encapsulant 1026 can be formed over the first package 1010, the second package 1014, the third package 1018, the fourth package 1022, the package connectors 1006, and the package leads 1004. The encapsulant can further provide the package leads 1004 or the first attach layer 1012 partially exposed providing connection surfaces for electrical signals or electrical levels such as power or ground.

Figure 11:
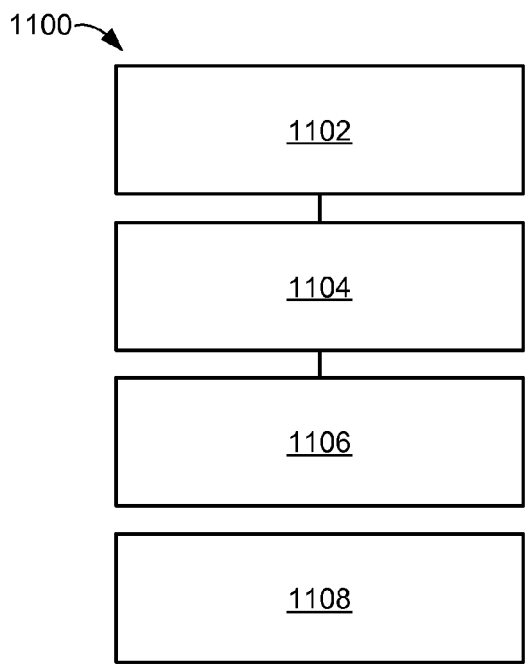
FIG. 11 is a flow chart of an integrated circuit package system for manufacturing the integrated circuit package system in an embodiment of the present invention.

Referring now to FIG. 11, therein is shown a flow chart of an integrated circuit package system 1100 for manufacturing the integrated circuit package system 100 in an embodiment of the present invention. The system 1100 includes providing a first integrated circuit die having die pads only adjacent a single edge of the first integrated circuit die in a block 1102; forming first bonding lands adjacent the single edge in a block 1104; connecting the die pads and the first bonding lands in a block 1106; and encapsulating the die pads and a portion of the first bonding lands to form a first package in a block 1108.

In greater detail, a system to provide the method and apparatus of the integrated circuit package system 100, in an embodiment of the present invention, is performed as follows:

1. Forming a first integrated circuit die having die pads on a first die active surface only adjacent a single edge of the first integrated circuit die.
2. Forming a leadframe having first bonding lands adjacent the single edge.
3. Electrically connecting the die pads to the first bonding lands.
4. Encapsulating a portion of the first integrated circuit die, the die pads, and portions of the first bonding lands to form a first package.

Thus, it has been discovered that the integrated circuit package system method and apparatus of the present invention furnish important and heretofore unknown and unavailable solutions, capabilities, and functional aspects. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method for manufacturing an integrated circuit package system comprising:
providing a first integrated circuit die having first die pads adjacent a first edge of the first integrated circuit die, the first integrated circuit die having a second edge opposite the first edge;
forming first bonding lands adjacent the first edge;
connecting the first die pads and the first bonding lands;
forming an encapsulant over the first die pads and the first bonding lands to form a first package, the first bonding lands within and partially exposed from the encapsulant;
providing a leadframe;
providing a second integrated circuit die having second die pads adjacent a third edge of the second integrated circuit die, the second integrated circuit die having a fourth edge opposite the third edge;
forming second bonding lands adjacent the third edge of the second integrated circuit die;
connecting the second die pads and the second bonding lands;
encapsulating the second die pads and portions of the second bonding lands to form a second package;
stacking the second package over the first package in an offset configuration such that the fourth edge covers and overhangs the second edge and the third edge is recessed from the first edge exposing the first die pads, wherein the first bonding lands and the second bonding lands are electrically connected to the leadframe; and
encapsulating the first package and the second package.

2. The method as claimed in claim 1 wherein forming the second bonding lands adjacent the third edge of the second integrated circuit die includes intermixing the second bonding lands with the first bonding lands.

3. The method as claimed in claim 1 further comprising:
providing a substrate; and
stacking the second package over the first package with the first bonding lands and the second bonding lands electrically connected to the substrate.

4. The method as claimed in claim 1, wherein:
providing the first integrated circuit die includes forming the first integrated circuit die having first die pads on a first die active side adjacent the first edge of the first integrated circuit die;
providing the leadframe includes forming the leadframe having first bonding lands adjacent the first edge;
connecting the first die pads and the first bonding lands includes electrically connecting the first die pads to the first bonding lands; and
forming the encapsulant includes forming the encapsulant over a portion of the first integrated circuit die.

5. The method as claimed in claim 4 wherein:
providing the second integrated circuit die includes providing the second integrated circuit die having a second die back side; and further comprising:
attaching the second die back side over the first die active side.

6. The method as claimed in claim 4 wherein:
providing the second integrated circuit die includes providing the second integrated circuit die having second die pads and a second die active side; and further comprising:
attaching the second die active side over the first die active side.

7. An integrated circuit package system comprising:
a first integrated circuit die having first die pads adjacent a first edge of the first integrated circuit die, the first integrated circuit die having a second edge opposite the first edge;
first bonding lands adjacent the first edge, the first bonding lands connected to the first die pads;
a first package having an encapsulant over the first die pads and the first bonding lands, the first bonding lands within and partially exposed from the encapsulant;
package leads;
a second integrated circuit die having second die pads adjacent a third edge of the second integrated circuit die, the second integrated circuit die having a fourth edge opposite the third edge;
second bonding lands adjacent the third edge of the second integrated circuit die having the second die pads and the second bonding lands connected;
a second package having the second die pads and portions of the second bonding lands encapsulated, the second package stacked over the first package in an offset configuration such that the fourth edge covers and overhangs the second edge and the third edge is recessed from the first edge exposing the first die pads, wherein the first bonding lands and the second bonding lands are electrically connected to the package leads; and
an additional encapsulant over the first package and the second package.

8. The system as claimed in claim 7 wherein:
the second bonding lands adjacent the third edge of the second integrated circuit die is intermixed with the first bonding lands.

9. The system as claimed in claim 7 further comprising:
a substrate; and
wherein the second package stacked over the first package with the first bonding lands and the second bonding lands electrically connected to the substrate.

10. The system as claimed in claim 7 wherein:
the first integrated circuit die is the first integrated circuit die having the first die pads on a first die active side adjacent the first edge of the first integrated circuit die;
the first bonding lands are electrically connected to the first die pads and adjacent the first edge; and
the first package is the first package having the encapsulant over a portion of the first integrated circuit die, the first die pads, and the first bonding lands.

11. The system as claimed in claim 10 wherein:
the second integrated circuit die includes a second die back side over the first die active side.

12. The system as claimed in claim 10 wherein:
the second integrated circuit die includes second die pads and a second die active side over the first die active side.

* * * * *